United States Patent
Chen et al.

(10) Patent No.: US 10,128,275 B2
(45) Date of Patent: *Nov. 13, 2018

(54) DISPLAY DEVICE

(71) Applicant: InnoLux Corporation, Miao-Li County (TW)

(72) Inventors: Hung-Kun Chen, Miao-Li County (TW); Hong-Kang Chang, Miao-Li County (TW); Hsieh-Li Chou, Miao-Li County (TW); Yu-Chien Kao, Miao-Li County (TW); Li-Wei Sung, Miao-Li County (TW); Jui-Ching Chu, Miao-Li County (TW); Hui-Min Huang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/490,026

(22) Filed: Apr. 18, 2017

(65) Prior Publication Data

US 2017/0229484 A1  Aug. 10, 2017

Related U.S. Application Data

(63) Continuation of application No. 14/644,426, filed on Mar. 11, 2015, now Pat. No. 9,659,973.

(30) Foreign Application Priority Data

Sep. 25, 2014 (TW) .............................. 103133162 A (51) Int. Cl.
*G02F 1/1345* (2006.01)
*H01L 27/12* (2006.01)
*G09G 5/00* (2006.01)

(52) U.S. Cl.
CPC .......... *H01L 27/124* (2013.01); *G02F 1/1345* (2013.01); *G02F 1/13452* (2013.01); *G09G 5/003* (2013.01)

(58) Field of Classification Search
CPC ... H01L 27/12; H01L 27/1214; H01L 27/124; H05K 7/00; G02F 1/136286;
(Continued)

(56) References Cited

U.S. PATENT DOCUMENTS 6,683,671 B1   1/2004  Morimoto
6,870,591 B2   3/2005  Lee et al.
(Continued)

FOREIGN PATENT DOCUMENTS

CN   102346339   2/2012
CN   102749731   10/2012
(Continued)

OTHER PUBLICATIONS

Chinese language office action dated Dec. 16, 2015, issued in application No. TW 103137142.
(Continued)

*Primary Examiner* — William F Kraig
*Assistant Examiner* — Khatib Rahman
(74) *Attorney, Agent, or Firm* — McClure, Qualey & Rodack, LLP (57) ABSTRACT

A display device is provided. The display device includes a display region, a first conductive loop disposed outside the display region, wherein the first conductive loop includes at least one first conductive block and at least two second conductive blocks, wherein a dielectric layer is disposed between the at least one first conductive block and the at least two second conductive blocks and has at least two via holes, and wherein the at least two second conductive blocks
(Continued)

are electrically connected the at least one first conductive block by the at least two via holes.

8 Claims, 9 Drawing Sheets

Related U.S. Application Data (60) Provisional application No. 61/952,929, filed on Mar. 14, 2014.

(58) Field of Classification Search
CPC .............. G02F 1/13345; G02F 1/13439; G02F 1/1345; G02F 1/13452; H03K 19/0175; G09G 5/003
See application file for complete search history.

(56) References Cited

U.S. PATENT DOCUMENTS

| | | | |
|---|---|---|---|
| 7,379,142 | B2 | 5/2008 | Tak et al. |
| 7,508,481 | B2 | 3/2009 | Whitehead, Jr. et al. |
| 7,924,393 | B2 | 4/2011 | Fukuoka et al. |
| 9,151,994 | B2 | 10/2015 | Change et al. |
| 9,176,339 | B2 | 11/2015 | Kim et al. |
| 2002/0140887 | A1 | 10/2002 | Maeda et al. |
| 2005/0157245 | A1 | 7/2005 | Lin et al. |
| 2006/0209235 | A1 | 9/2006 | Kim |
| 2006/0284643 | A1 | 12/2006 | Yamamoto et al. |
| 2008/0170195 | A1 | 7/2008 | Kwon et al. |
| 2009/0273749 | A1 | 11/2009 | Miyamoto et al. |
| 2009/0310051 | A1* | 12/2009 | Kim .................. G02F 1/136204 349/40 |
| 2011/0025940 | A1 | 2/2011 | Liu et al. |
| 2012/0257135 | A1 | 10/2012 | Chen et al. |
| 2012/0268708 | A1 | 10/2012 | Chida |
| 2012/0281159 | A1* | 11/2012 | Chen .................... G02F 1/1345 349/40 |
| 2012/0327338 | A1 | 12/2012 | Kobayashi et al. |
| 2013/0342795 | A1 | 12/2013 | Park et al. |
| 2014/0029230 | A1 | 1/2014 | Oh et al. |
| 2014/0225849 | A1 | 8/2014 | Anno et al. |

FOREIGN PATENT DOCUMENTS

| | | |
|---|---|---|
| CN | 103513470 | 1/2014 |
| JP | 2003-66467 | 3/2003 |
| JP | 2006-171386 | 6/2006 |
| JP | 3946498 | 7/2007 |
| TW | 200527679 | 8/2005 |
| TW | 200712614 | 4/2007 |
| TW | 201005360 | 2/2010 |
| TW | I335482 | 11/2011 |
| TW | 201202812 | 1/2012 |
| TW | 201239489 | 10/2012 |
| TW | 201307945 | 2/2013 |
| TW | 201321851 | 6/2013 |
| TW | I408471 | 9/2013 |

OTHER PUBLICATIONS

Chinese language office action dated Dec. 28, 2015, issued in application No. TW 103137140.
Chinese language office action dated Mar. 1, 2016, issued in application No. TW 103132928.
Office Action dated Apr. 12, 2016, issued in U.S. Appl. No. 14/643,169.
Office Action dated Apr. 13, 2016, issued in U.S. Appl. No. 14/656,363.
Office Action dated Apr. 5, 2016, issued in U.S. Appl. No. 14/656,461.
Chinese language office action dated Jun. 4, 2016, issued in application No. TW 103133162.
Chinese language office action dated Oct. 15, 2015, issued in application No. TW 103141941.
Chinese language office action dated Nov. 10, 2015, issued in application No. TW 103113162.
Chinese language office action dated Dec. 10, 2015, issued in application No. TW 103140591.

* cited by examiner

DISPLAY DEVICE

CROSS REFERENCE TO RELATED APPLICATIONS

This application is a Continuation of U.S. patent application Ser. No. 14/644,426, filed on Mar. 11, 2015, and entitled "Display device", now U.S. Pat. No. 9,659,973, which claims the benefit of U.S. Provisional Application No. 61/952,929, filed on Mar. 14, 2014, and claims priority of Taiwan Patent Application No. 103133162, filed on Sep. 25, 2014, the entireties of which are incorporated by reference herein.

BACKGROUND

Technical Field

The disclosure relates to a display device, and in particular to a display device with a fanout area.

Description of the Related Art

As digital technology develops, display devices are becoming more widely used in our society. For example, display devices have been applied to modern information and communication devices such as televisions, notebooks, computers, mobile phones and smartphones. In addition, each generation of display devices has been developed to be thinner, lighter, smaller and more fashionable.

There is an urgent necessity for a display device with high resolution under the premise that the size of the display device is fixed. A general display device includes a display region and a peripheral region. The display region is used to display the image, and there are a driving element and a fanout area disposed on the peripheral region. There are a plurality of conductive lines disposed on the fanout area in order to connect the inner circuit of the display region to the driving element of the peripheral region. However, in order to enhance the resolution of the display device, the number of conductive lines connecting the inner circuit to the driving element should be increased, resulting in the area occupied by the fanout area also increasing. Therefore, the display region of the display device would be limited by the increased peripheral region.

Therefore, a novel display device having a peripheral region with a high integration degree is required to solve the aforementioned problems.

SUMMARY

The disclosure provides a display device including: a display region; a driving element; and a plurality of signal line pairs, wherein the display region is electrically connected the driving element through the plurality of signal line pairs, wherein at least one of the signal line pairs includes a first conductive line and a second conductive line, wherein the first conductive line and the second conductive line are electrically isolated from each other, and wherein at least a part of the first conductive line overlaps with the second conductive line.

According to other embodiments of the disclosure, the display device of the disclosure includes a display region; a driving element; a fanout area disposed between the display region and the driving element. The fanout area includes a first circuit area, a second circuit area, and a third circuit area. The first circuit area is adjacent to the display region, the third circuit area is adjacent to the driving element, and the second circuit area disposed between the first circuit area and third circuit area. The display region and the driving element are electrically connected to each other via a plurality of signal line pairs are. At least one of the signal line pairs includes a first conductive line and a second conductive line, wherein at least a part of the first conductive line overlaps the second conductive line in the second circuit area.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

The display device of the disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first layer disposed on a second layer", may indicate not only the direct contact of the first layer and the second layer, but also a non-contact state with one or more intermediate layers between the first layer and the second layer. In the above situation, the first layer may not directly contact the second layer.

It should be noted that the elements or devices in the drawings of the disclosure may be present in any form or configuration known to those skilled in the art. In addition, the expression "a layer overlying another layer", "a layer is disposed above another layer", "a layer is disposed on another layer" and "a layer is disposed over another layer"

may refer to a layer that directly contacts the other layer, and they may also refer to a layer hat does not directly contact the other layer, there being one or more intermediate layers disposed between the layer and the other layer.

In addition, in this disclosure, relative expressions are used. For example, "lower", "bottom", "higher" or "top" are used to describe the position of one element relative to another. It should be appreciated that if a device is flipped upside down, an element at a "lower" side will become an element at a "higher" side.

The drawings described are only schematic and are non-limiting. In the drawings, the size, shape, or thickness of some of the elements may be exaggerated and not drawn on scale for illustrative purposes. The dimensions and the relative dimensions do not correspond to actual location to practice of the disclosure. The disclosure will be described with respect to particular embodiments and with reference to certain drawings but the disclosure is not limited thereto.

Moreover, the use of ordinal terms such as "first", "second", "third", etc., in the disclosure to modify an element does not by itself connote any priority, precedence, or order of one claim element over another or the temporal order in which it is formed, but are used merely as labels to distinguish one claim element having a certain name from another element having the same name (but for use of the ordinal term) to distinguish the claim elements.

The disclosure provides a display device that has a fanout area with circuits that are integrated to a high degree in order to reduce the space occupied by the fanout area. Therefore, the display device can have a high resolution under the premise that the size of the display device is fixed.

In addition, according to an embodiment of the disclosure, the display device of the disclosure can further include a first conductive loop, having a plurality of conductive blocks, outside the display region, in order to prevent the display device from damage caused by electrostatic discharge during the process.

Moreover, according to an embodiment of the disclosure, the display device of the disclosure can further include a second conductive loop outside the display region, wherein a sealant is disposed over the second conductive loop and close to the peripheral boundary of the display device, in order to achieve a high electrostatic discharge ability.

Figure 1:
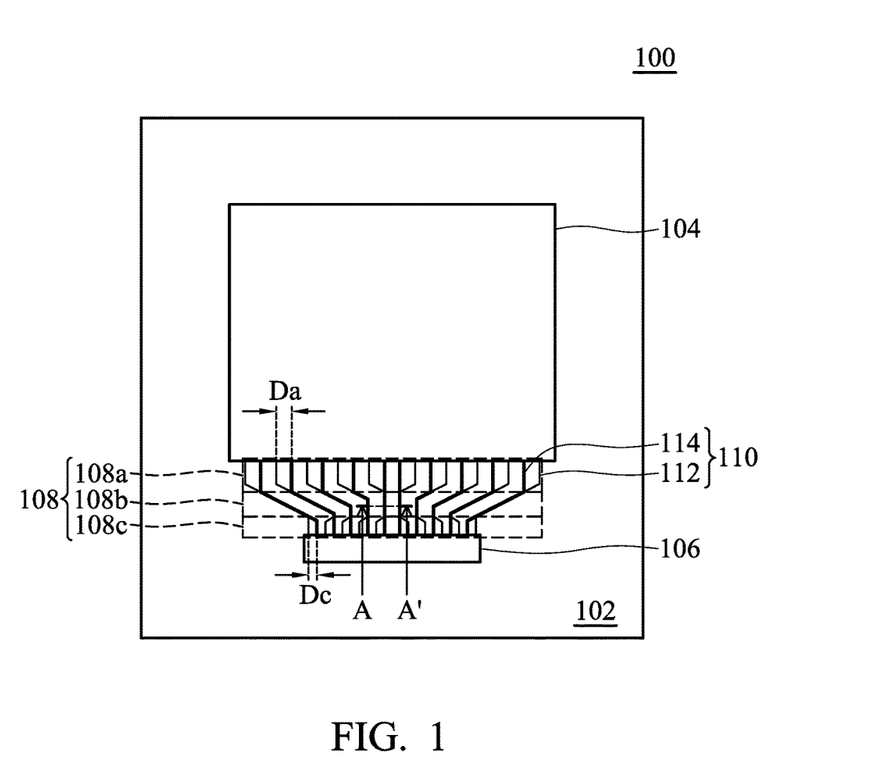
FIG. 1 is a top view of a display device according to an embodiment of the disclosure.

FIG. 1 shows a top-view of a display device according to an embodiment of the disclosure. The display device 100 includes a display region 104 and a driving element 106 disposed on a substrate 102. The display device 100 can be a liquid-crystal display (such as thin film transistor liquid-crystal display), or an organic electroluminescent display (such as active full-color organic electroluminescent display). The display region 104 has a plurality of pixels (not shown), and the driving element 106 is electrically connected to the display region 104 via a plurality of signal line pairs 110, in order to provide input to the pixels of the display region 110 so that the display device can display images. In particular, the display region 104 is separated from the driving element 106 by a fanout area 108, and a plurality of signal line pairs 110 are disposed on the fanout area 108. At least one of the signal line pairs 110 includes a first conductive line 112 and a second conductive line 114, wherein the first conductive line 112 and the second conductive line 114 are electrically isolated from each other. The first conductive line 112 and the second conductive line 114 transmit different signals. For example, each of the pixels disposed in the display region 104 can have at least three sub-pixels (such as red sub-pixel, blue sub-pixel, and green sub-pixel; or, red sub-pixel, blue sub-pixel, green sub-pixel, and white sub-pixel), and the various signals produced by the driving element 106 are transmitted to the sub-pixels via the first conductive lines 112 and second conductive lines 114. In addition, In the fanout area 108, at least a part of the first conductive line 112 overlaps with the second conductive line 114.

As still shown in FIG. 1, the fanout area 108 can be defined as a first circuit area 108a, a second circuit area 108b, and a third circuit area 108c, wherein the first circuit area 108a is adjacent to the display region 104, the third circuit area 108c is adjacent to the driving element 106, and the second circuit 108b area disposed between the first circuit area 108a and third circuit area 108c.

According to an embodiment of the disclosure, in the first circuit area 108a, any of the first conductive line 112 and the adjacent second conductive line 114 are separated by a distance (minimum horizontal distance) Da. Namely, the first conductive block 112 and the second conductive block 114 adjacent to the first conductive block 112 are separated from each other. In the third circuit area 108c, any the first conductive line 112 and the adjacent second conductive line 114 are separated by a distance (minimum horizontal distance) Dc. In particular, the distance Da (the distance between the first conductive block 112 and the second conductive block 114 adjacent to the first conductive block 112) can be from 3 to 40 µm, the distance Dc can be from 3 µm to 18 µm, and the distance Da is longer than the distance Dc.

Figure 2A:
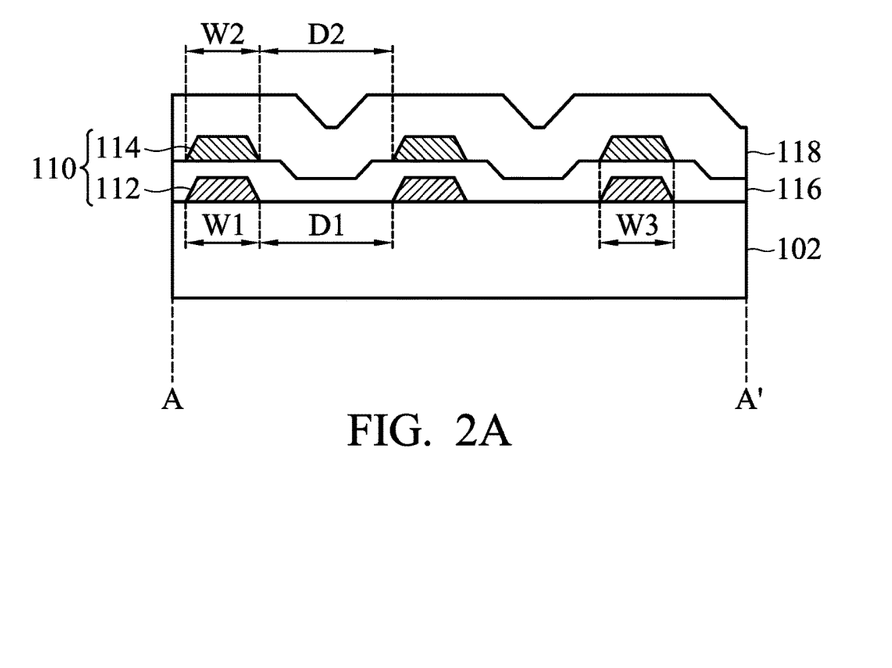
FIG. 2A is a cross-sectional view of the display device shown in FIG. 1 along the line A-A'.

FIG. 2A shows a cross-sectional view of FIG. 1 along line A-A'. As shown in FIG. 2A, in the second circuit area 108b, the first conductive line 112 and the second conductive line 114 of the same signal line pair 110 can partially overlap each other. As a result, the horizontal projection area of the first conductive line 112 and the second conductive line 114 can be reduced, and the integration degree of the fanout area 108 can be increased.

As shown in FIG. 2A, the first conductive line 112 can be disposed on the substrate 102. A dielectric layer 116 can be disposed on the substrate 102 to cover the first conductive line 112. The second conductive line 114 can be disposed on the dielectric layer 116, and the first conductive line 112 can overlap with the second conductive line 114. A passivation layer 118 can be disposed on the dielectric layer 116 to cover the second conductive line 114. In particular, the substrate 102 can be quartz, glass, silicon, metal, plastic, or ceramic. Suitable materials for the first conductive lines 112 and the second conductive lines 114 include a single-layer or multilayer metal conductive material (such as aluminum (Al), copper (Cu), molybdenum (Mo), titanium (Ti), platinum (Pt), iridium (Ir), nickel (Ni), chromium (Cr), silver (Ag), gold (Au), tungsten (W), or an alloy thereof), metal-containing conductive material (such as: aluminum-containing compound, copper-containing compound, molybdenum-containing compound, titanium-containing compound, platinum-containing compound, iridium-containing compound, nickel-containing compound, chromium-containing compound, silver-containing compound, gold-containing compound, tungsten-containing compound, magnesium-containing compound, or a combination thereof), or a combination thereof. Furthermore, the first conductive line 112 and the second conductive line 114 can be made of the same or different material. The dielectric layer 116 can be silicon nitride, silicon oxide, silicon oxynitride, silicon carbide, aluminum oxide, or a combination thereof. The passivation layer 118 can be made of organic insulating materials (such as photosensitive resins) or inorganic insulating materials (such as silicon nitride, silicon oxide, silicon oxynitride, silicon carbide, aluminum oxide, or a combination thereof), in order to isolate the first conductive line 112 and the second conductive line 114 from air and moisture. In addition, according to an embodiment of the disclosure, the first conductive line 112 and the second conductive line 114 have tapered sidewalls, as shown in FIG. 2A. In particular, the tapered sidewall of the first conductive line 112 or the second conductive line 114 has an inclination angle of 15 to 90° from horizontal. Further, the inclination angle of the first conductive line 112 can be equal to or different from that of the second conductive line 114.

Figure 2B:
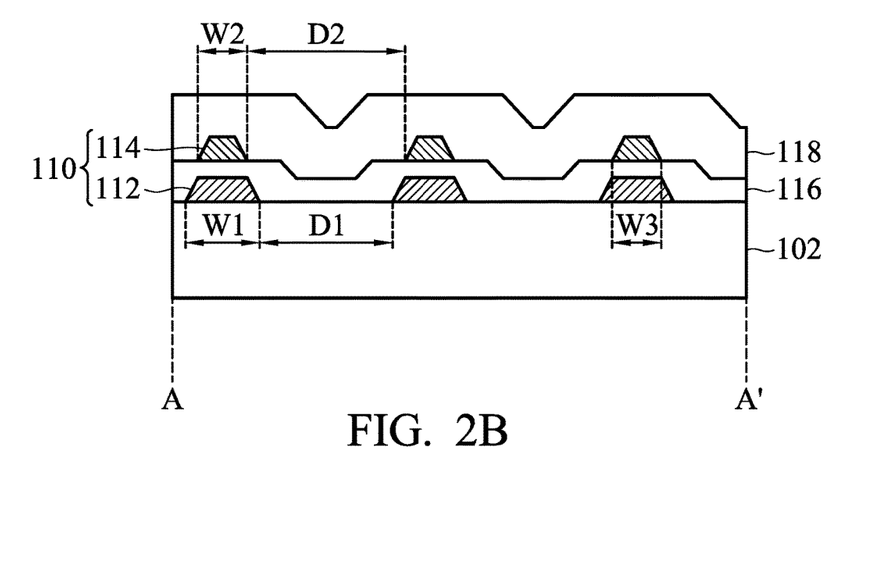
FIGS. 2B and 2C are cross-sectional views of the display devices according to some embodiments of the disclosure along the line A-A' of FIG. 1.

According to an embodiment of the disclosure, the width W1 of the first conductive line 112 can be from 2 to 10 μm, the width W2 of the second conductive line 114 can be from 2 to 10 μm, and the width W1 can be equal to the width W2 (as shown in FIG. 2A). Further, the width W1 of the first conductive line 112 can be different from the width W2 of the second conductive line 114 (as shown in FIG. 2B). Namely, the ratio of the width W1 of the first conductive line 112 to the width W2 of the second conductive line 114 is from 1 to 5. For example, as shown in FIG. 2B, the width W1 of the first conductive line 112 can be larger than the width W2 of the second conductive line 114. In addition, as shown in FIGS. 2A and 2B, the second conductive line 114 can completely overlap with the first conductive line 112 (i.e., the horizontal projection of the second conductive line 114 can completely overlap the horizontal projection of the first conductive line 112).

According to an embodiment of the disclosure, in the second circuit area 108b, any two adjacent first conductive lines 112 are separated by a distance D1 (i.e., the minimum horizontal distance between the two adjacent first conductive lines 112 in the second circuit area 108b). Further, in the second circuit area 108b, any two adjacent second conductive lines 114 are separated by a distance D2 (i.e., the minimum horizontal distance between the two adjacent second conductive lines 114 in the second circuit area 108b). In particular, the distance D1 can be from 2 to 30 μm, and the distance D2 can be from 2 to 30 μm.

According to an embodiment of the disclosure, in the second circuit area 108b, the sum (W1+D1) of the width W1 of the first conductive line 112 and the distance D1 can be equal to the sum (W2+D2) of the width W2 of the second conductive line 114 and the distance D2. In addition, the ratio (D1/(W1+D1)) of the distance D1 and the sum of the distance D1 and the width W1 can be from 0.1 to 0.66. When the ratio (D1/(W1+D1)) is greater than or equal to 0.1, a sealant (not shown) subsequently formed within the second circuit area 108b is apt to be completely cured after a curing process (irradiating an energy from the substrate 102 side). On the other hand, when the ratio (D1/(W1+D1)) is less than or equal to 0.66, the integration degree of conductive lines of the second circuit area 108b can be increased.

According to embodiments of the disclosure, the overlapping portion of the first conductive line 112 and the second conductive line 114 (i.e., the overlapping portion of the horizontal projection of the first conductive line 112 and the horizontal projection of the second conductive line 114) has a width W3 (i.e., the minimum horizontal width). Further, the ratio (W3/W1) of the width W3 and the width W1 of the first conductive line 112 is from 0.3 to 1.

Figure 2C:
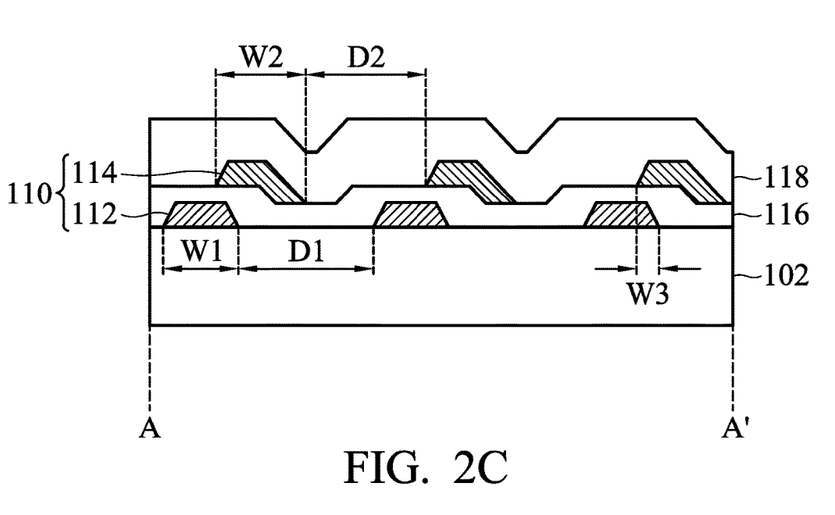

With respect to the signal line pair 110 in the second circuit area 108b, at least a part of the first conductive line 112 can overlap with the second conductive line 114 (i.e., at least a part of the horizontal projection of the first conductive line 112 can overlap the horizontal projection of the second conductive line 114), as shown in FIG. 2C. Herein, the relationship between the width W1 of the first conductive line 112, the width W2 of the second conductive line 114, and the width W3 can be defined by the following equation:

$$(W1+W2-W3)/W1 \geq 1$$

Figure 3:
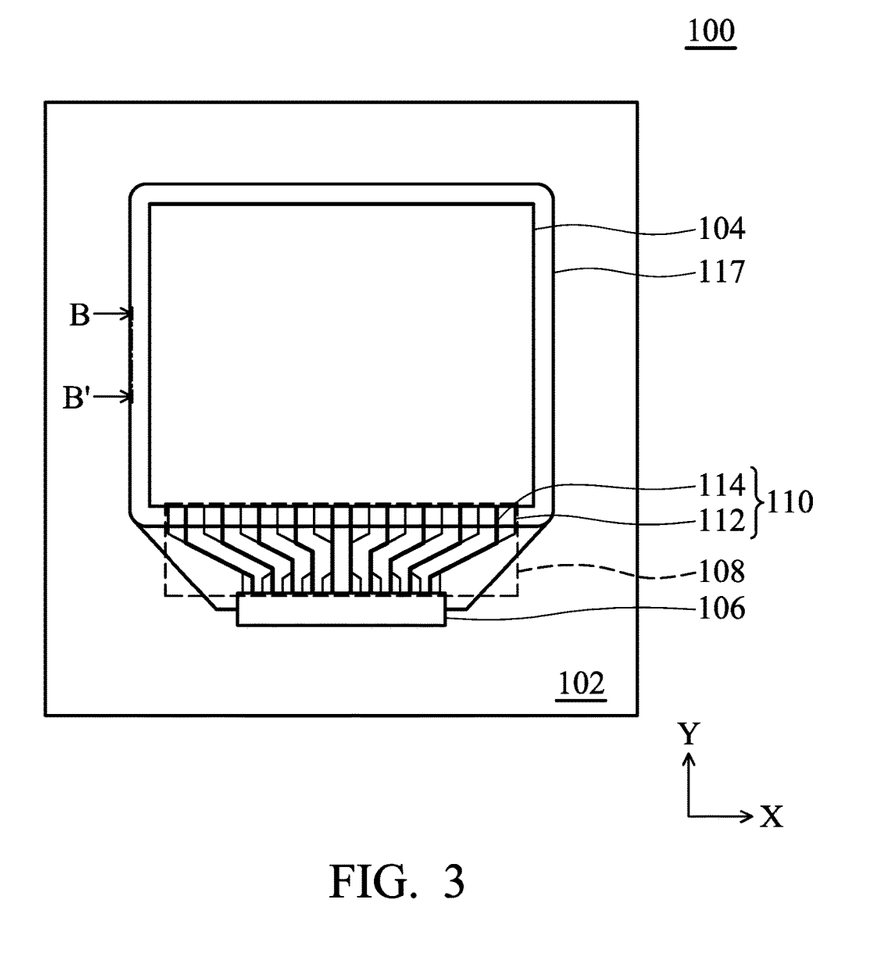
FIG. 3 is a top view of a display device according to another embodiment of the disclosure.

FIG. 3 is a top-view of a display device 100 according to an embodiment of the disclosure. Besides the display region 104, the driving element 106, and the fanout area 108, the display device 100 further includes a first conductive loop 117 disposed outside the display region 104. As shown in FIG. 3, the first conductive loop 117 can be disposed on the substrate 102 and surround the display region 104. Further, the first conductive loop 117 can be electrically connected to the driving element 106, and the driving element 106 can provide a voltage signal to the first conductive loop 117 in order to force the first conductive loop 117 to generate a reference voltage. Since the first conductive loop 117 would overlap with the signal line pairs 110 in the fanout area 108, another conducting layer can be used as a substitute for the first conductive loop 117 or the signal line pairs 110 in order to avoid contact between the first conductive loop 117 and the signal line pairs 110.

Figure 4A:
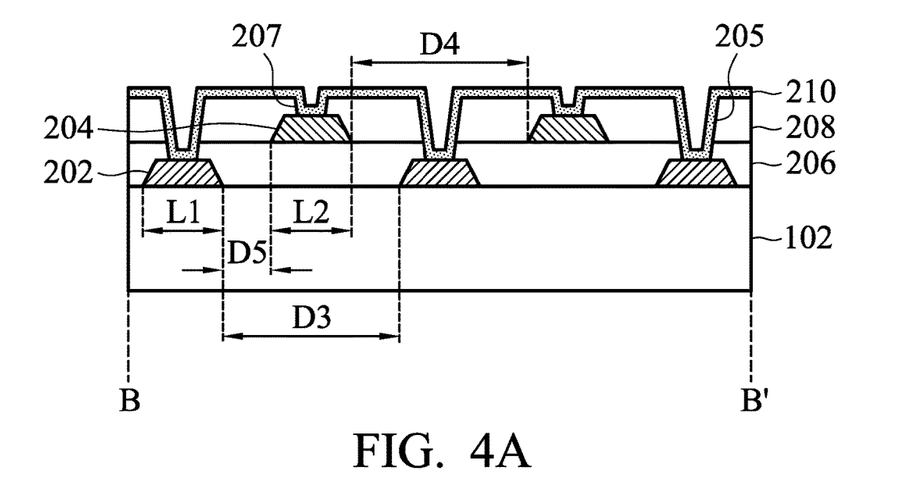
FIG. 4A is a cross-sectional view of the display device shown in FIG. 3 along the line B-B'.

According to an embodiment of the disclosure, at least a part of the first conductive loop 117 includes a plurality of first conductive blocks 202 and a plurality of second conductive blocks 204. The first conductive blocks 202 and the second conductive blocks 204 are electrically connected to each other. FIG. 4A shows a cross-sectional view of the display device 100 of FIG. 3 along line B-B'. According to an embodiment of the disclosure, the part of the first conductive loop 117 including the plurality of first conductive blocks 202 and the plurality of second conductive blocks 204 can be disposed on the two opposite sides of the display region 104, and the part of the first conductive loop 117 can be perpendicular to a first axis X (i.e. parallel to a second axis Y). In an embodiment of the disclosure, since there are a plurality of data lines (not shown) disposed on the two opposite sides of the display region 104 corresponding to the first axis X (i.e. the plurality of data lines perpendicular to the first axis X), the part of the first conductive loop 117 including the plurality of first conductive blocks 202 and the plurality of second conductive blocks 204 is not apt to be disposed parallel to the first axis X. In some embodiments of the disclosure, the part of the first conductive loop 117 including the plurality of first conductive block 202 and the plurality of second conductive block 204 can be also disposed on the two opposite sides of the display region 104 and parallel to a first axis X.

As shown in FIG. 4A, the plurality of first conductive blocks 202 can be disposed on the substrate 102. A dielectric layer 206 can be disposed on the substrate 102 to cover the first conductive blocks 202. The plurality of second conductive blocks 204 can be disposed on the dielectric layer 206. A passivation layer 208 can be disposed on the dielectric layer 206 to cover the second conductive blocks 204. In addition, a plurality of first via holes 205 pass through the dielectric layer 206 and the passivation layer 208, exposing the first conductive block 202. A plurality of second via holes 207 pass through the passivation layer 208, exposing the second conductive block 204. A conducting layer 210 can be disposed on the passivation layer 208 to fill into the first via hole 205 and the second via hole 207, resulting in the plurality of first conductive blocks 202 and the plurality of second conductive blocks 204 being electrically connected to each other via the conducting layer 210.

According to an embodiment of the disclosure, the first conductive block 202 and the second conductive block 204 can be a made of single-layer or multilayer metal conductive material (such as aluminum (Al), copper (Cu), molybdenum (Mo), titanium (Ti), platinum (Pt), iridium (Ir), nickel (Ni), chromium (Cr), silver (Ag), gold (Au), tungsten (W), or an alloy thereof), metal-containing conductive material (such as: aluminum-containing compound, copper-containing compound, molybdenum-containing compound, titanium-containing compound, platinum-containing compound, iridium-containing compound, nickel-containing compound, chromium-containing compound, silver-containing compound, gold-containing compound, tungsten-containing compound, magnesium-containing compound, or a combination thereof), or a combination thereof. Further, the materials of first conductive blocks 202 and second conductive blocks 204 can be the same or different. According to an embodiment of the disclosure, the first conductive blocks 202 and the first conductive line 112 can be formed in the same process and made of the same material; and/or, the second conductive blocks 204 and the second conductive line 114 can be formed in the same process and made of the same material. The dielectric layer 206 can be silicon nitride, silicon oxide, silicon oxynitride, silicon carbide, aluminum oxide, or a combination thereof. Further, the dielectric layer 206 and the dielectric layer 116 can be formed in the same process and made of the same material. The passivation layer 208 can be organic insulating materials (such as photosensitive resins) or inorganic insulating materials (such as silicon nitride, silicon oxide, silicon oxynitride, silicon carbide, aluminum oxide, or a combination thereof). The passivation layer 208 and the passivation layer 118 can be formed in the same process and made of the same material. In addition, the conducting layer 210 can be a single-layer or multilayer transparent conducting layer, and the material of the conducting layer 210 can be ITO (indium tin oxide), IZO (indium zinc oxide), AZO (aluminum zinc oxide), ZnO (zinc oxide), tin oxide, indium oxide, or a combination thereof.

As still shown in FIG. 4A, in order to prevent the display device 100 from damage caused by electrostatic discharge during the fabrication of the display device, the first conductive block 202 can have a length L1 between 10 and 10000 μm, and the second conductive block 204 can have a length L2 between 10 and 10000 μm. In addition, any two adjacent first conductive blocks 202 are separated by a distance D3, any two adjacent second conductive blocks 204 are separated by a distance D4, and any two adjacent first and second conductive blocks 202 and 204 are separated by a distance D5. In particular, the distance D3 is from 16 to 100 μm, the distance D4 is from 16 to 100 μm, and the distance D5 is from 3 to 40 μm.

Figure 4B:
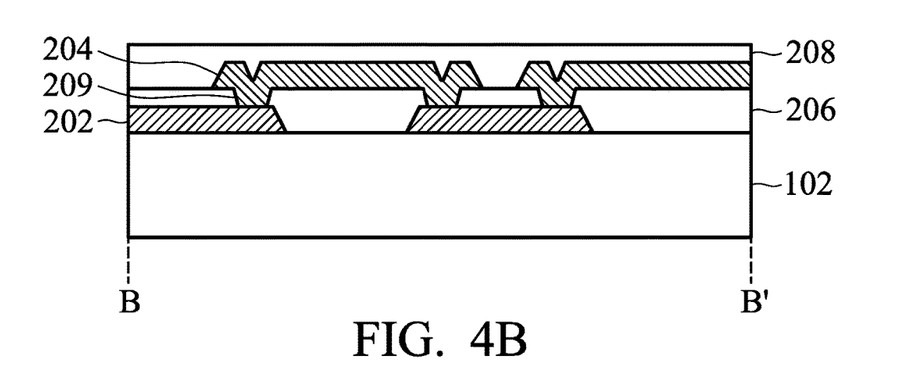
FIGS. 4B and 4C are cross-sectional views of the display devices according to some embodiments of the disclosure along the line B-B' of FIG. 3.

According to another embodiment of the disclosure, any two adjacent first conductive blocks 202 can be electrically connected to each other via the second conductive block 204 adjacent to the two adjacent first conductive blocks 202. As shown in FIG. 4B, the plurality of first conductive blocks 202 can be disposed on the substrate 102. The dielectric layer 206 can be disposed on the substrate 102 to cover the first conductive block 202. A plurality of third via holes 209 pass through the dielectric layer 206 exposing the first conductive block 202. The plurality of second conductive blocks 204 can be disposed on the dielectric layer 206 to fill into the third via hole 209, forcing the second conductive block 204 to overlap with the two first conductive block 202 adjacent to the second conductive block 204. Therefore, the first conductive blocks 202 and the second conductive blocks 204 can be electrically connected to each other in the absence of the conducting layer 210.

Figure 4C:
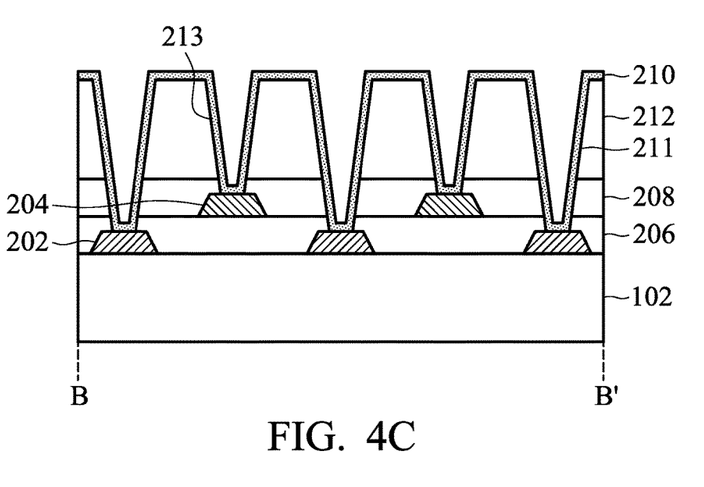

According to other embodiments of the disclosure, as shown in FIG. 4C, a planarization layer 212 can be further formed on the passivation layer 208. A plurality of fourth via holes 211 pass through the dielectric layer 206, the passivation layer 208, and the planarization layer 212, exposing the first conductive blocks 202. A plurality of fifth via holes 213 pass through the passivation layer 208 and the planarization layer 212, exposing the second conductive blocks 204. The conducting layer 210 can be formed on the planarization layer 212 to be filled into the fourth via hole 211 and the fifth via hole 213, resulting in the first conductive blocks 202 and the second conductive blocks 204 being electrically connected to each other via the conducting layer 210. In particular, the planarization layer 212 can be a layer with insulating properties, such as a dielectric material, or photosensitive resin.

Figure 5:
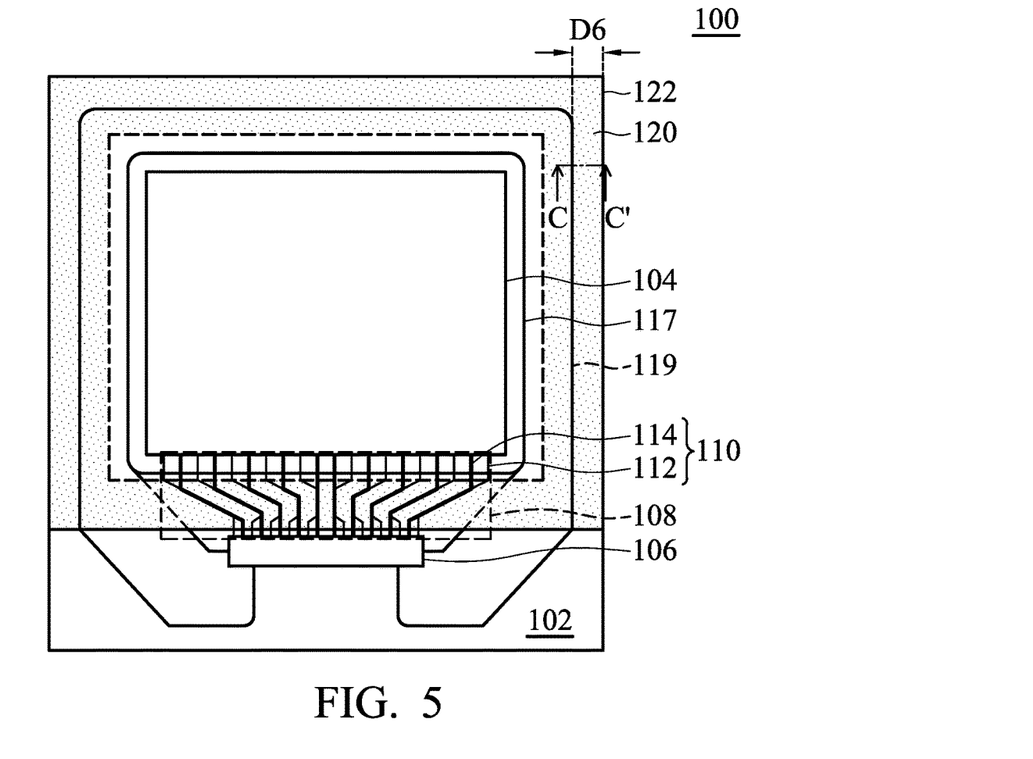
FIG. 5 is a top view of a display device according to still another embodiment of the disclosure.

FIG. 5 shows a top view of the display device 100 according to an embodiment of the disclosure. In addition to the display region 104, the driving element 106, the fanout area 108, and the first conductive loop 117, the display device 100 can further include a second conductive loop 119. The second conductive loop 119 can be disposed on substrate 102 outside the display region 104 and the first conductive loop 117. As shown in FIG. 5, the second conductive loop 119 can be disposed on the substrate 102 to surround the display region 104 and connect to the driving element 106. The second conductive loop 119 can serve as an electrostatic discharge (ESD) protection element, preventing the pixels within the display region 104 from damage caused by electrostatic discharge. In addition, a sealant 120 can be disposed on the substrate 102 to cover a part of the second conductive loop 119. In particular, a region defined by projecting the sealant 120 to the substrate 102 serves as a package region (not shown). The second conductive loop 119 within the package region is completely covered by the sealant 120.

The second conductive loop 119 can be single-layer or multilayer metal conductive material (such as aluminum (Al), copper (Cu), molybdenum (Mo), titanium (Ti), platinum (Pt), iridium (Ir), nickel (Ni), chromium (Cr), silver (Ag), gold (Au), tungsten (W), or an alloy thereof), metal-containing conductive material (such as aluminum-containing compound, copper-containing compound, molybdenum-containing compound, titanium-containing compound, platinum-containing compound, iridium-containing compound, nickel-containing compound, chromium-containing compound, silver-containing compound, gold-containing compound, tungsten-containing compound, magnesium-containing compound, or a combination thereof), or a combination thereof. According to an embodiment of the disclosure, the second conductive loop 119 can be formed simultaneously during the process for forming the first conductive blocks 202 and the second conductive blocks 204. In addition, the sealant can be a resin.

Figure 6:
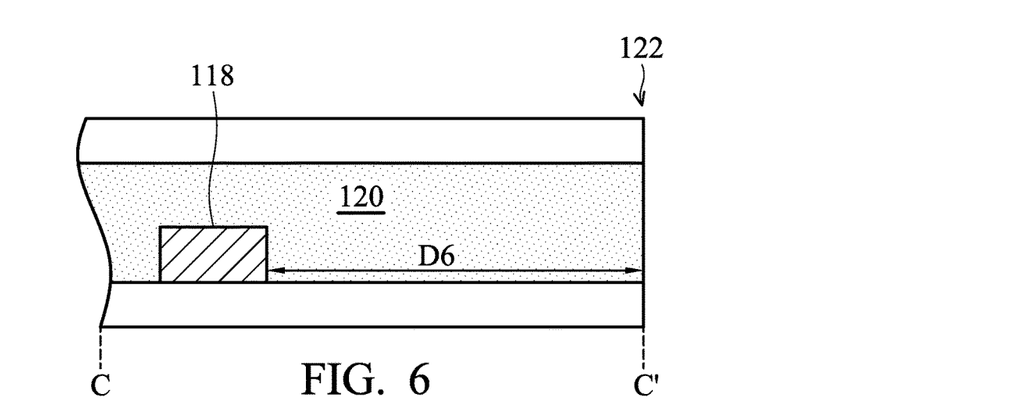
FIG. 6 is a cross-sectional view of the display device shown in FIG. 5 along the line C-C'.

As shown in FIG. 5, the display device 100 has a peripheral boundary 122. In the package region, there is no distance between the sealant 120 and the peripheral boundary 122 (the horizontal distance between the sealant 120 and the peripheral boundary 122 is 0). FIG. 6 is a cross-sectional view of the display device 100 as shown in FIG. 5 along line C-C'. As shown in FIG. 6, the second conductive loop 119 and the peripheral boundary 122 are separated by a distance D6, and the sealant 120 is disposed on the second conductive loop 119 within the peripheral boundary 122. Namely, the space between the second conductive loop 119 and the peripheral boundary 122 is filled with the sealant 120. It should be noted that the distance D6 is from 50 to 300 μm in order to prevent the second conductive loop 119 from erosion and corrosion by moisture and air and achieve the electrostatic discharge (ESD) protection ability of the second conductive loop 119.

Figure 7:
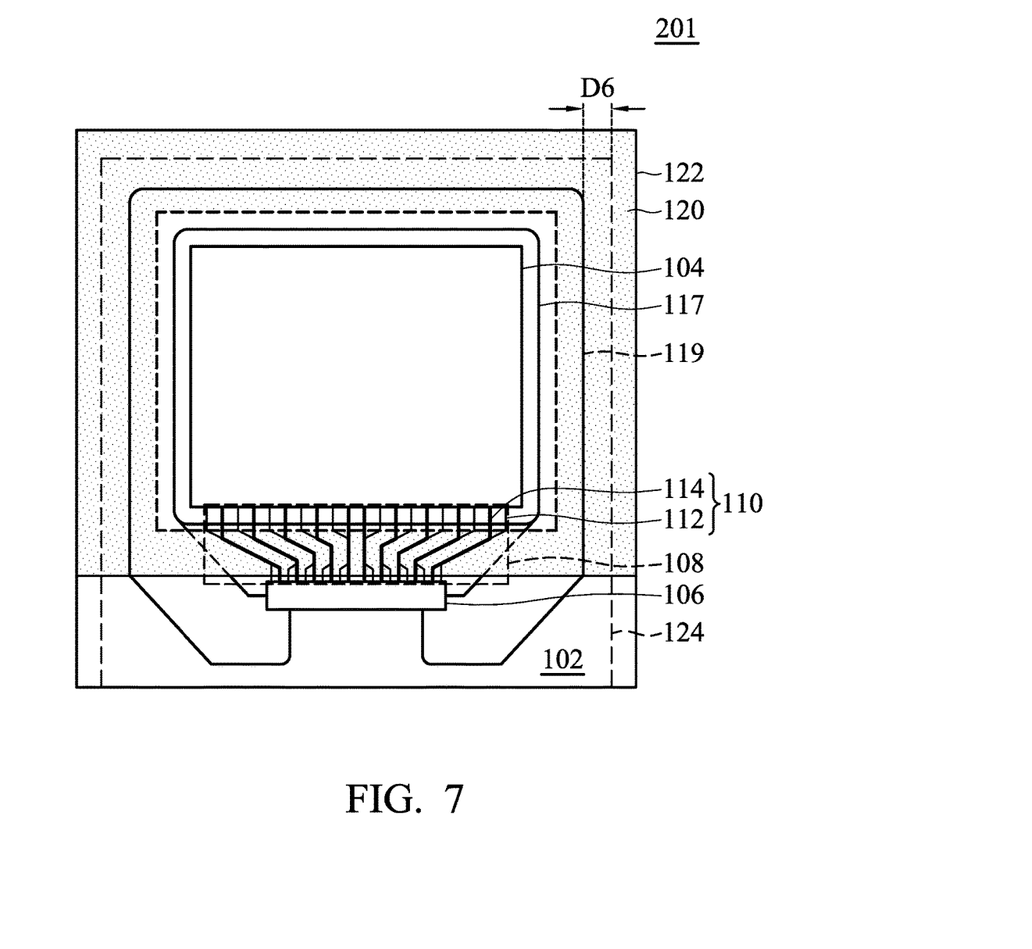
FIGS. 7 and 8 are top views of display device mother substrates according to embodiments of the disclosure.

In order to ensure that the second conductive loop 119 is not be uncovered by the sealant 120 due to a processing error, a so-called "cutting-on-sealant process" is employed during the processes for fabricating the display device of the disclosure. FIG. 7 shows a schematic top view of a display device mother substrate 201 according to an embodiment of the disclosure. The display device as shown in FIG. 5 can be obtained after cutting the display device mother substrate 201 via a cutting process. As shown in FIG. 7, when forming the sealant 120 on the substrate 102, the sealant 120 is formed to cover the predetermined cutting line 124. Therefore, after performing the cutting process (using for example, a single-tool cutting process, a multi-tool cutting process, or a laser cutting process) along the predetermined cutting line 124, there is no distance between the peripheral boundary 122 and the sealant 120 of the obtained display device 100 (such as the display device 100 as shown in FIG. 5). Further, the second conductive loop 119 is separated from the peripheral boundary 122 by the distance D6. As shown in FIG. 7, the sealant 120 can be formed to contact the peripheral boundary 122.

Figure 8:
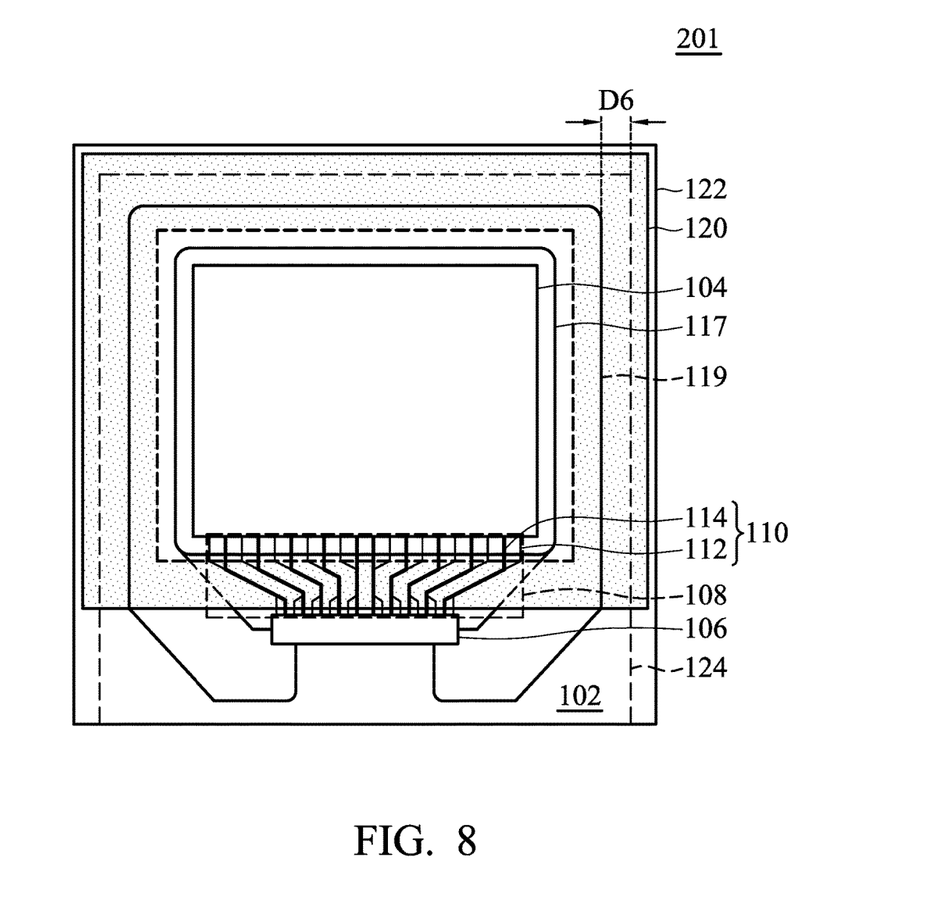

In addition, according to an embodiment of the disclosure, when forming the sealant 120 on the substrate 102, the sealant 120 can cover the predetermined cutting line 124 and not contact the peripheral boundary 122, as shown in FIG. 8. After performing the cutting process along the predetermined cutting line 124, the display device 100 as shown in FIG. 5 can be still obtained.

Accordingly, the area occupied by the fanout area of the display device of the disclosure can be lowered resulting from increasing the conductive line integration degree in the fanout area. Therefore, the display device can have a larger display region under the premise that the size of the display device is fixed. In addition, the display device of the disclosure can further include a first conductive loop outside the display region, wherein the first conductive loop includes a plurality of conductive blocks. Therefore, the first conductive loop can prevent the display device from damage caused by electrostatic discharge during the fabrication of the display device. Moreover, the display device of the disclosure can further include a second conductive loop outside the display region, wherein a sealant is disposed on the second conductive loop and within the peripheral boundary of the display device, in order to achieve high electrostatic discharge ability of the second conductive loop.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A display device, comprising:
a display region;
a first conductive loop disposed outside the display region,
a second conductive loop disposed outside the display region;
a sealant disposed on a part of the second conductive loop; and
a peripheral boundary outside the display region, wherein the first conductive loop comprises at least one first conductive block and at least two second conductive blocks, wherein a dielectric layer is disposed between the at least one first conductive block and the at least two second conductive blocks and has at least two via holes, and wherein the at least two second conductive blocks are separated from each other, and the at least two second conductive blocks are electrically connected to the at least one first conductive block by the at least two via holes, and wherein a distance between the sealant and the peripheral boundary is 0, and a distance between the second conductive loop and the peripheral boundary is from 50 to 300 μm.

2. The display device as claimed in claim 1, wherein the at least two second conductive blocks are disposed on two opposite sides of the display region.

3. The display device as claimed in claim 1, wherein the dielectric layer comprises silicon nitride, silicon oxide, silicon oxynitride, silicon carbide, aluminum oxide, or a combination thereof.

4. The display device as claimed in claim 1, wherein the at least two second conductive blocks are electrically connected to the at least one first conductive block by a conducting layer disposed in the at least two via holes.

5. The display device as claimed in claim 4, wherein the conducting layer comprises indium tin oxide, indium zinc oxide, aluminum zinc oxide, zinc oxide, tin oxide, indium oxide, or a combination thereof.

6. The display device as claimed in claim 1, wherein the at least one first conductive block and the at least two second conductive blocks comprise single-layer or multilayer metal.

7. The display device as claimed in claim 1, wherein the at least one first conductive block and the at least two second conductive blocks comprise aluminum, copper, molybdenum, titanium, platinum, iridium, nickel, chromium, silver, gold, tungsten, an alloy thereof, or a combination thereof.

8. The display device as claimed in claim 1, wherein the at least one first conductive block and the at least two second conductive blocks are separated from each other by the dielectric layer.

* * * * *